(12) United States Patent
Doi

(10) Patent No.: US 6,172,527 B1
(45) Date of Patent: Jan. 9, 2001

(54) OUTPUT CIRCUIT CAPABLE OF REDUCING FEEDTHROUGH CURRENT

(75) Inventor: Hitoshi Doi, Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/285,035

(22) Filed: Apr. 1, 1999

(30) Foreign Application Priority Data

Jan. 13, 1999 (JP) .................................................. 11-006735

(51) Int. Cl.$^7$ .................. H03K 19/0175; H03K 19/003; H03K 19/02
(52) U.S. Cl. .................................. 326/83; 326/27; 326/57
(58) Field of Search ................................. 326/83, 82, 86, 326/85, 26, 27, 56, 57, 58

(56) References Cited

U.S. PATENT DOCUMENTS

| | | | |
|---|---|---|---|
| 5,001,369 | * | 3/1991 | Lee .......................................... 326/58 |
| 5,173,627 | * | 12/1992 | Lien ......................................... 326/57 |
| 5,825,215 | * | 10/1998 | Sugio et al. ........................... 327/108 |
| 5,920,210 | * | 7/1999 | Kaplinsky ............................. 327/112 |
| 5,933,025 | * | 8/1999 | Nance et al. ............................. 326/81 |

FOREIGN PATENT DOCUMENTS

| | | |
|---|---|---|
| 5-33417 | 2/1993 | (JP) . |
| 6-267276 | 9/1994 | (JP) . |

* cited by examiner

*Primary Examiner*—Michael Tokar
*Assistant Examiner*—James H. Cho
(74) *Attorney, Agent, or Firm*—Jones Volentine, LLC

(57) ABSTRACT

Signals inputted from nodes N2 and N4 to output circuit 100 are respectively transmitted to clocked inverters 31 and 32. Clocked inverter 31 is activated when node N4 is H level while clocked inverter 32 is activated when node N2 is L level. Output signal of clocked inverter 31 is supplied to gate electrode of PMOS 61 via node N5 while output signal of clocked inverter 32 is supplied to gate electrode of NMOS 62 via node N6. Voltage level of node N5 is pulled up when node N4 is L level while voltage level of node N6 is pulled down when node N2 is H level. With such a construction, it is possible to provide the output circuit capable of reducing feedthrough current without deteriorating high speed responsivity.

6 Claims, 4 Drawing Sheets

OUTPUT CIRCUIT CAPABLE OF REDUCING FEEDTHROUGH CURRENT

BACKGROUND OF THE INVENTION

1. Field of the Invention

The invention relates to an output circuit, particularly to an output circuit capable of taking out three states of an output terminal, namely, a power supply voltage level, ground voltage level and a high impedance state.

2. Description of the Related Art

In a semiconductor integrated circuit, there is provided an output circuit for driving a load of an external circuit that operates in response to an output signal from the semiconductor integrated circuit and a wiring having a large load capacitor in the semiconductor integrated circuit. Accordingly, transistors constituting the output circuit have a large driving capacity compared with general transistors constituting the semiconductor integrated circuit.

An output stage of the output circuit is generally composed of two transistors that are serially connected with each other between a power supply voltage supply terminal (referred to as power voltage supply terminal) and a ground voltage supply terminal, wherein the connecting point of these transistors forms an output terminal. With such a construction, there occurs a timing when these two transistors are conducted, thereby producing a feedthrough current. Since the output circuit employs transistors having such a large driving capacity, the feedthrough current becomes large. The feedthrough current in such an output circuit is to negligible in the semiconductor integrated circuit requiring a low consumption power. As a method of reducing the feedthrough current of the output circuit is disclosed, for example, in the following literature.

Name of literature: Japanese Patent publication No. 8-84057

The aforementioned literature employs a NAND gate or a NOR gate wherein a timing when one or both signals having complementary voltage levels are inputted to the NAND gate or the NOR gate in delayed by an inverter to render both transistors nonconductive, then to render one transistor conductive. With such a construction, two transistors constituting an output stage of the output circuit does not become conductive at the same time.

In the method disclosed in the aforementioned literature, an output signal of the output stage always generates a high impedance state for the time corresponding to the delay time by the inverter. Accordingly, even in a timing when feedthrough current is not produced depending on two input signals inputted to the output circuit, the high impedance state is always generated for a given time. Accordingly, high speed responsivity of the output circuit is to always satisfied.

As viewed from input terminals of the output circuit to which signals are inputted, there occurs delay in the operation of the output stage by the time involved in passing through the NAND gate or NOR gate in addition to the delay by the inverter. In this case, if a noise is generated in the signal inputted to the output circuit, the state of the output signal from the output circuit is stabilized after it is temporarily rendered to a high impedance state via the inverter, the NAND gate or NOR gate.

It is an object of the invention to solve the aforementioned problems and provide an output circuit capable of reducing a feedthrough current in the output stage of the output circuit without deteriorating the high speed responsivity.

It is another object of the invention to provide an output circuit capable of reducing the increase of the number of elements as much as possible, thereby achieving the above object.

It is still another object of the invention to provide an output circuit capable of achieving the above object even if a noise is generated in signals to be inputted thereto.

SUMMARY OF THE INVENTION

To achieve the above objects, in an output circuit for outputting an output signal that is set to either first voltage level, or second voltage level or high impedance state in response to voltage levels of first and second data signals according to the invention, the output circuit comprises a first gate circuit that is connected with a first node to which a first signal having a voltage level which is set at least by one voltage level of either first or second data signal is transmitted, and that shapes a waveform to the first signal, a second gate circuit that is connected with a second node to which a second signal having a voltage level which is set at least by one voltage level of either first or second data signal is transmitted, and that shapes a waveform of the second signal, a first transistor for electrically connecting a first power voltage supply terminal and an output terminal thereof in response to a voltage level of an output signal of the first gate circuit, a second transistor for electrically connecting a second power voltage supply terminal and an output terminal thereof in response to a voltage level of the output signal of the second gate circuit, a first control circuit for applying a voltage, that renders the first transistor nonconductive in response to a voltage level of the second node, to a gate electrode of the first transistor, a second control circuit for applying a voltage, that renders the second transistor nonconductive in response to a voltage level of the first node, to a gate electrode of the second transistor, wherein the first gate circuit is selectively set to a state capable of outputting the first signal that has been shaped in waveform, or to a high impedance state in response to the voltage level of the second node, and wherein the second gate circuit is selectively set to a state capable of outputting the second signal that has been shaped in waveform, or to a high impedance state in response to the voltage level of the first node.

Further, the output circuit of the invention may include a plurality buffers circuits provided between the output terminal of the first gate circuit and the gate electrode of the first transistor, and a plurality of buffer circuits provided between the output terminal of the second gate circuit and the gate electrode of the second transistor.

Still further, the output circuit of the invention may have the first signal formed of an output signal of a first differential logic circuit and the second signal formed of an output signal of a second differential logic circuit.

Still more further, the output circuit of the invention may include the first differential logic circuit that receives first and second control signals as input signals which are generated in response to the voltage level of the first data signal and the voltage level of the second data signal, and the second differential logic circuit that receives third and fourth control signals as input signals which are generated in response to the voltage level of the first data signal and the voltage level of the second data signal.

PREFERRED EMBODIMENT OF THE INVENTION

An output circuit of the invention is described in detail with reference to the attached drawings.

Figure 1:
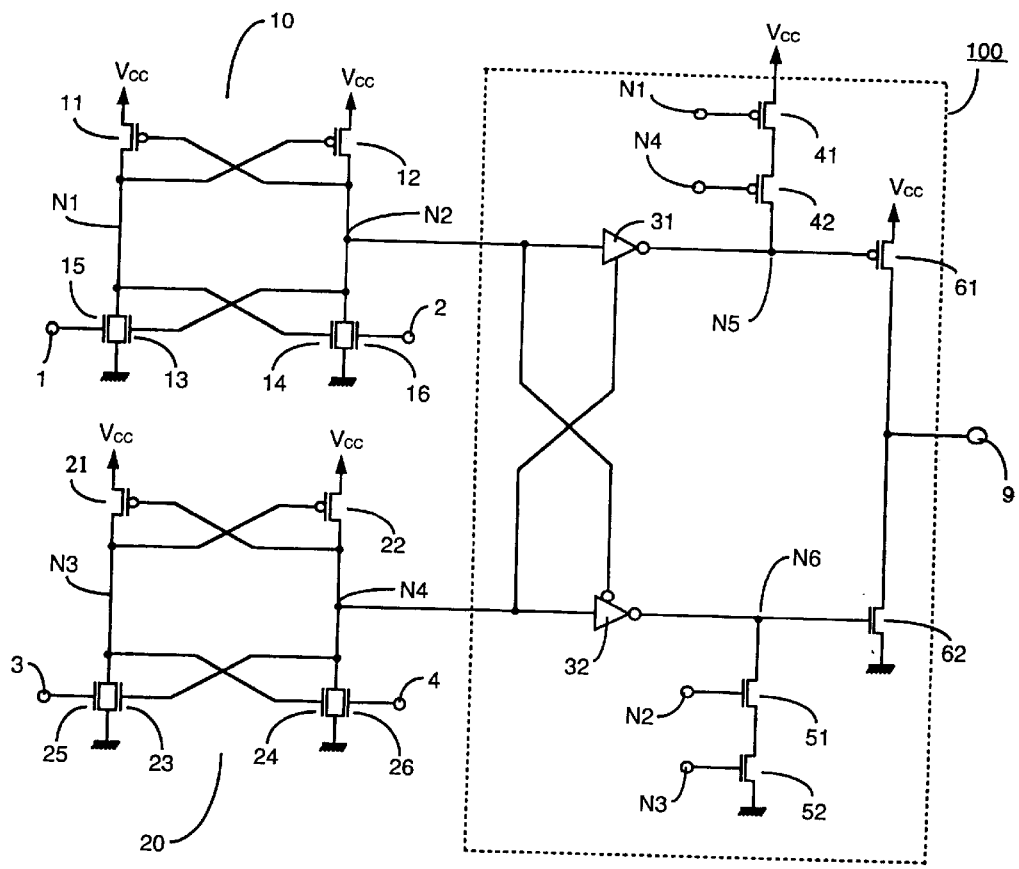
FIG. 1 is a circuit diagram of an output circuit 100 according to a first embodiment of the invention.

FIG. 1 is a circuit diagram of output circuit 100 according to the first embodiment of the invention.

In FIG. 1, output circuit 100 comprises clocked inverts 31 and 32 each mainly composed of a gate circuit, p-channel MOS transistors 41 and 42, n-channel MOS transistors 51 and 52, p-channel MOS transistor 61 and n-channel type transistor 62 respectively constituting an output stage. In a description set forth hereunder, p-channel MOS transistor is referred to as PMOS, and n-channel MOS transistor is referred to NMOS. In description set forth hereunder, power supply voltage Vcc is applied to each substrate terminal of NMOSes while the ground voltage Vss is applied to each substrate terminal of NMOSes.

An input terminal of clocked inverter 31 is connected with node N2, and an output terminal thereof is connected with gate electrode of PMOS 61 via node N5. A control terminal of clocked inverter 31 is connected with node N4. Likewise, input terminal of clocked inverter 32 is connected with node N4, and an output terminal thereof is connected with gate electrode of NMOS 62 via node N6. An inverse control terminal of clocked inverter 32 is connected with node N2.

Figure 2:
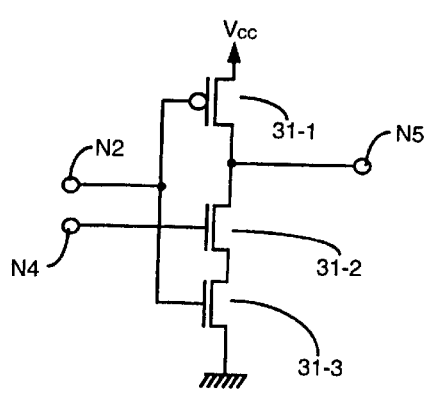
FIG. 2 is a circuit diagram of a clocked inverter 31.
Figure 3:
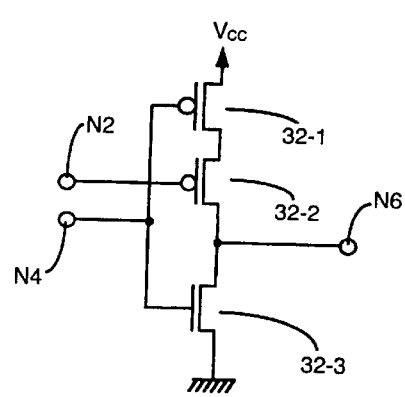
FIG. 3 is a circuit diagram of a clocked inverter 32.

Concrete circuit diagrams of clocked inverters 31 and 32 are respectively illustrated in FIGS. 2 and 3.

In FIG. 2, clocked inverter 31 comprises PMOS 31-1, and NMOSes 31-2 and 31-3. The power supply voltage Vcc is applied to one electrode of PMOS 31-1 while the other electrode is connected with node N5 as the output terminal of clocked inverter 31. One electrode of NMOS 31-2 is connected with node N5 as the output terminal of clocked inverter 31 while the other electrode is connected with one electrode of NMOS 31-3. Since the other electrode of NMOS 31-3 is grounded, the ground voltage Vss is applied to NMOS 31-3. A gate electrode of PMOS 31-1, and gate electrode of NMOS 31-3 are respectively connected with node N2 while gate electrode of NMOS 31-2 is connected with node N4.

As is evident from the construction set forth above, that is, NMOS 31-2 of clocked inverter 31 becomes conductive when voltage level of node N4 is the power supply voltage (hereinafter referred to as H level). Accordingly, clocked inverter 31 functions as an inverter composed of PMOS 31-1 and NMOS 31-3, thereby inversing and outputting voltage level of a signal transmitted to node N2. When voltage level of node N4 is the ground voltage level (hereinafter referred to as L level), NMOS 31-2 becomes nonconductive. Accordingly, when voltage level of node N2 is L level, the output of clocked inverter 31 becomes H level while when voltage level of node N2 is H level, the output of clocked inverter 31 becomes unstable (high impedance state).

In FIG. 3, clocked inverter 32 comprises PMOSes 32-1 and 32-2, and NMOS 32-3. The power supply voltage Vcc is applied to one electrode of PMOS 32-1 while the other electrode is connected with one electrode of PMOS 32-1. The other electrode of PMOS 32-2 is connected with node N6 as the output terminal of clocked inverter 32. Since one electrode of NMOS 32-3 is connected with node N6 as the output terminal of clocked inverter 32 while the other electrode is grounded, the ground voltage Vss is applied to NMOS 32-3. A gate electrode of PMOS 32-1, and gate electrode of NMOS 32-3 are respectively connected with node N4 while gate electrode of PMOS 32-2 is connected with node N2.

As is evident from the construction set forth above, that is, in clocked inverter 32, PMOS 32-2 of clocked inverter 32 becomes conductive when voltage level of node N2 is L level. Accordingly, clocked inverter 32 functions as an inverter composed of PMOS 32-1 and NMOS 32-3, thereby inversing and outputting voltage level of a signal transmitted to node N4. When voltage level of node N2 is H level, PMOS 32-2 becomes nonconductive. Accordingly, when voltage level of node N4 is H level, the output of clocked inverter 31 becomes L level while when voltage level of node N4 is L level, the output of clocked inverter 32 becomes unstable (high impedance state).

The constructions of clocked inverters 31 and 32 are not limited to the constructions as illustrated in FIGS. 2 and 3. For example, in FIG. 2, gate electrode of PMOS 31-1 and gate electrode of NMOS 31-2 may be connected with node N2 while gate electrode of the 31-3 may be connected with node N4. Further, in FIG. 3, gate electrode of PMOS 32-2 and gate electrode o NMOS 32-3 may be connected with node N4 while gate electrode of PMOS 32-1 may be connected with node N2.

In FIG. 1, the power supply voltage Vcc is applied to one electrode of PMOS 41 and the other electrode thereof is connected with one electrode of PMOS 42. The other electrode of PMOS 42 is connected with node N5. A gate electrode of PMOS 41 is connected with node N1, described later while gate electrode of PMOS 42 is connected with node N4.

When both voltage levels of nodes N1 and N4 are L level, both PMOSes 41 and 42 become conductive. Accordingly, the power supply voltage Vcc is applied to node N5 via PMOSes 41 and 42. That is, voltage level of node N5 is pulled up to H level. When one or both of voltage levels of nodes N1 and N4 are H level, one or both of PMOSes 41 and 42 become nonconductive. As a result, the power supply voltage Vcc is prohibited to be applied to node N5. In such a manner, PMOSes 41 and 42 function as a control circuit to control voltage level of node N5.

One electrode of NMOS 51 is connected with node N6 while the other electrode thereof is connected with one electrode of NMOS 52. The other electrode of NMOS 52 is grounded so that the ground voltage Vss is applied to NMOS 52. A gate electrode of NMOS 51 is connected with node N2 while gate electrode of NMOS 52 is connected with node N3, described later.

When voltage levels of both nodes N2 and N3 are H level, both NMOSes 51 and 52 become conductive. Accordingly, the ground voltage Vss is applied to node N6 via NMOSes 51 and 52. That is, voltage level of node N6 is pulled down to L level. When one or both of voltage levels of nodes N2 and N3 are L level, one or both of NMOSes 51 and 52 become nonconductive. Accordingly, the ground voltage Vss is prohibited to be applied to node N6. In such a manner, both NMOSes 51 and 52 function as a control circuit to control voltage level of node N6.

The power supply voltage Vcc is applied to one electrode of PMOS 61 constituting the output stage of output circuit 100 while the other electrode thereof is connected with output terminal 9 of output circuit 100. A gate electrode of PMOS 61 is connected with node N5. One electrode of NMOS 62 constituting the output state of output circuit 100 is grounded so that the ground voltage Vss is applied to NMOS 62 and the other electrode thereof is connected with output terminal 9. A gate electrode of NMOS 62 is connected with node N6. Since both PMOS 61 and NMOS 62 need to have a large driving capacity, they become large in size compared with other MOS transistors.

Although output circuit 100 is structured as set forth above, a signal to be inputted to output circuit 100, namely, signals to be transmitted to nodes N2 and N4 are respectively generated by differential logic circuits 10 and 20.

The differential logic circuit 10 comprises PMOSes 11 and 12 and NMOSes 13 to 16. The power supply voltage Vcc is applied to respective one electrodes of NMOSes 11 and 12. The other electrode of NMOS 11 is connected with node N1 while the other electrode of NMOS 12 is connected with node N2. A gate electrode of NMOS 11 is connected with node N2 while gate electrode of NMOS 12 is connected with node N1.

Further, respective one electrodes of NMOSes 13 to 16 constituting differential logic circuit 10 are grounded so that the ground voltage Vss is applied to NMOSes 13 to 16. The other electrodes of NMOSes 13 and 15 are connected with node N1 while the other electrode of NMOSes 14 and 16 are connected with node N2. A gate electrode of NMOS 13 is connected with node N2 and gate electrode of NMOS 14 is connected with node N1 while gate electrode of NMOS 15 is connected with signal terminal 1, described later, and gate electrode of NMOS 16 is connected with signal terminal 2, described later.

In differential logic circuit 10 having the construction set forth above, when voltage level of a signal inputted to signal terminal 1 is H level and voltage level of a signal inputted to signal terminal 2 is L level, NMOS 13 becomes conductive and NMOS 16 becomes nonconductive. Accordingly, the ground voltage Vss is applied to node N1 so that voltage level of node N1 becomes L level. In response to voltage level of node N1, NMOS 12 becomes conductive and NMOS 14 becomes nonconductive. As a result, the power supply voltage Vcc is applied to node N2 so that voltage level of node N2 becomes H level. Further, in response to voltage level of node N2, NMOS 11 becomes nonconductive and NMOS 13 becomes conductive.

When voltage level of the signal inputted to signal terminal 1 is L level and voltage level of the signal inputted to signal terminal 2 is H level, NMOS 15 becomes nonconductive and NMOS 16 becomes conductive. Accordingly, the ground voltage Vss is applied to node N2 so that voltage level of node N2 becomes L level. In response to voltage level of node N2, NMOS 11 becomes conductive and NMOS 13 becomes nonconductive. Accordingly, the power supply voltage Vcc is applied to node N1 so that voltage level of node N1 becomes H level. In response to voltage level of node N1, NMOS 12 becomes nonconductive and NMOS 14 becomes conductive.

Even if voltage levels of both signal terminals 1 and 2 become L level after voltage levels of nodes N1 and N2 are set, voltage levels of nodes N1 and N2 are kept to a voltage level set by NMOSes 13 and 14. Further, when the voltage levels of both nodes N1 and N2 become H level, differential logic circuit 10 can not keep voltage levels set to nodes N1 and N2, and hence voltage levels of nodes N1 and N2 are controlled not to become H level. This control will be described later.

If voltage levels of both nodes N1 and N2 are L level during initialization, they become unstable, and hence a feed through current is produced. Accordingly, the initialization is preferably performed during initialization. Since the MOS transistors constituting differential logic circuit 10 are sufficient to have a small driving capacity compared with the MOS transistors constituting output circuit 100, the feed through current produced in differential logic circuit 10 is very small compared with the feedthrough current produced in the output stage of output circuit 100.

Similarly, differential logic circuit 20 comprises PMOSes 21 and 22 and NMOSes 23 to 26. The power supply voltage Vcc is applied to respective one electrodes of PMOSes 21 and 22. The other electrode of PMOS 21 is connected with node N3 while the other electrode of PMOS 22 is connected with node N4. A gate electrode of PMOS 21 is connected with node N4 while gate electrode of PMOS 22 is connected with node N3.

Further, respective one electrodes of NMOSes 23 to 26 constituting differential logic circuit 20 are grounded so that the ground voltage Vss is applied to respective NMOSes 23 to 26. The other electrodes of NMOSes 23 and 25 are connected with node N3 while the other electrode of NMOSes 24 and 26 are connected with node N4. A gate electrode of NMOS 23 is connected with node N4 and gate electrode of NMOS 24 is connected with node N3 while gate electrode of NMOS 25 is connected with signal terminal 3, described later, and gate electrode of NMOS 26 is connected with signal terminal 4, described later.

In differential logic circuit 20 having the construction set forth above, when voltage level of a signal inputted to signal terminal 3 is H level and voltage level of a signal inputted to signal terminal 4 is L level, NMOS 25 becomes conductive and NMOS 26 becomes nonconductive. Accordingly, the ground voltage Vss is applied to node N3 so that voltage level of node N3 becomes L level. In response to voltage level of node N3, PMOS 22 becomes conductive and NMOS 24 becomes nonconductive. As a result, the power supply voltage Vcc is applied to node N4 so that voltage level of node N4 becomes H level. Further, in response to voltage level of node N4, PMOS 21 becomes nonconductive and NMOS 23 becomes conductive.

When voltage level of a signal inputted to signal terminal 3 is L level and voltage level of a signal inputted to signal terminal 4 is H level, NMOS 25 becomes nonconductive and NMOS 26 becomes conductive. Accordingly, the ground voltage Vss is applied to node N4 so that voltage level of node N4 becomes L level. In response to voltage level of node N4, PMOS 21 becomes conductive and NMOS 23 becomes nonconductive. Accordingly, the power supply voltage Vcc is applied to node N3 so that voltage level of node N3 becomes H level. In response to voltage level of node N3, PMOS 22 becomes nonconductive and NMOS 24 becomes conductive.

Even if voltage levels of both signal terminals 3 and 4 become L level after voltage levels of nodes N3 and N4 are set, voltage levels of nodes N3 and N4 are kept to a voltage level set by NMOSes 23 and 24. Further, when the voltage levels of both nodes N3 and N4 become H level, differential logic circuit 20 can not keep voltage level set to nodes N3 and N4, and hence voltage levels of nodes N3 and N4 are controlled not to become H level. This control will be described later.

If voltage levels of both nodes N3 and N4 are L level during initialization, they become unstable, and hence a feedthrough current is produced. Accordingly, the initialization is preferably performed during initialization. Since the MOS transistors constituting differential logic circuit 20 are sufficient to have a small driving capacity compared with the MOS transistors constituting output circuit 100, the feedthrough current produced in differential logic circuit 20 is very small compared with the feedthrough current produced in the output stage of output circuit 100.

Figure 4:
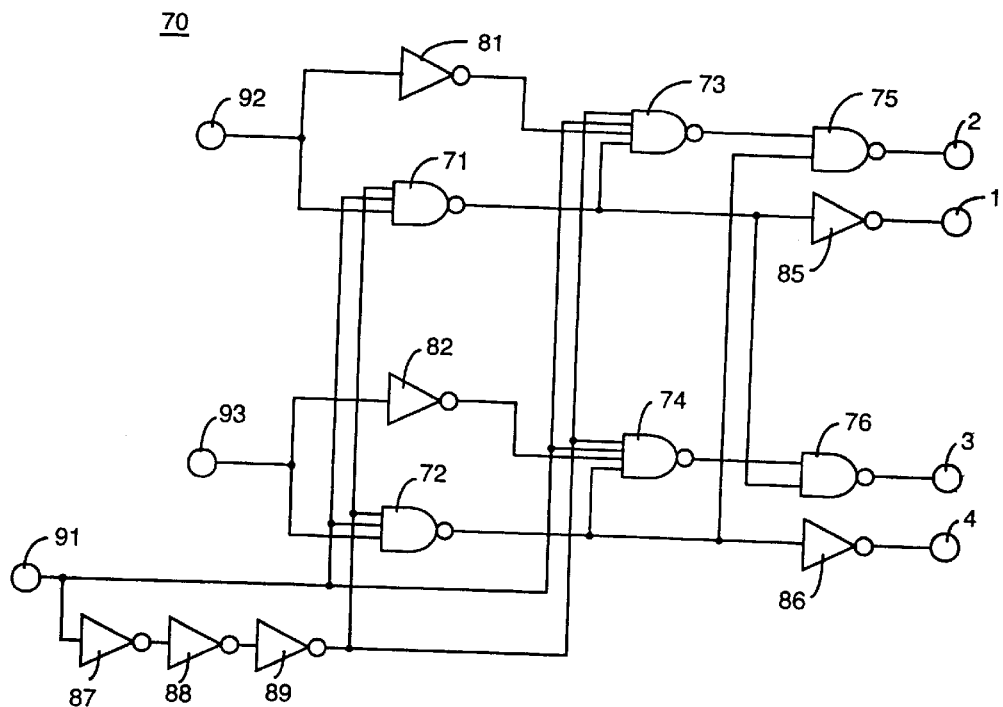
FIG. 4 is a circuit diagram of a signal generated circuit 70.

A signal generating circuit for generating signals to be inputted to signal terminals 1 to 4. FIG. 4 is a circuit diagram of a signal generating circuit 70.

The signal generating circuit 70 comprises NAND gates 71 to 76, inverters 81, 82, 85 to 89. NAND gates 71 and 72 respectively have three input terminals and one output terminal, and NAND gates 73 and 74 respectively have four input terminals and one output terminal, and NAND gates 75 and 76 respectively have two input terminals and one output terminal. The signal generating circuit 70 has three input terminals 91, 92 and 93 and four output terminals. Since the output terminals of signal generating circuit 70 are respectively connected with signal terminals 1 to 4 of differential logic circuits 10 and 20, respective output terminals of signal generating circuit 70 are denoted by the same reference numerals as those of signal terminals 1 to 4 of differential logic circuits 10 and 20.

In FIG. 4, clock signal CLK is inputted to input terminal 91 and first data signal DATA1 is inputted to input terminal 92, while second data signal DATA2 is inputted to input terminal 93.

Input terminal 91 is connected with respective one input terminals of NAND gates 71 to 74 and input terminal of inverter 87. An output terminal of inverter 87 is connected with input terminal of inverter 88 and an output terminal of inverter 88 is connected with input terminal of inverter 89. An output terminal of inverter 89 is connected with respective one input terminals of NAND gates 71 to 74.

Input terminal 92 is connected with input terminal of inverter 81 and one of input terminals of NAND gate 71. Input terminal 93 is connected with input terminal of inverter 82 and one of input terminals of NAND gate 72.

An output terminal of inverter 81 and the output terminal of NAND gate 71 are respectively connected with two of input terminals of NAND gate 73. The output terminal of NAND gate 71 is also connected with input terminal of inverter 85 and one input terminal of NAND gate 76.

An output terminal of inverter 82 and the output terminal of NAND gate 72 are respectively connected with two of input terminals of NAND gate 74. The output terminal of NAND gate 72 is also connected with input terminal of inverter 86 and one input terminal of NAND gate 75.

The output terminal of NAND gate 73 is connected with the other input terminal of NAND gate 75 and the output terminal of NAND gate 74 is connected with the other input terminal of NAND gate 76.

An output terminal of inverter 85 is connected with signal terminal 1 of differential logic circuit 10 and the output terminal of NAND gate 75 is connected with signal terminal 2 of differential logic circuit 10 while the output terminal of NAND gate 76 is connected with signal terminal 3 of differential logic circuit 20 and an output terminal of inverter 86 is connected with signal terminal 4 of differential logic circuit 20.

The operation of signal generating circuit 70 having the construction set forth above is now described hereinafter.

Figure 5:
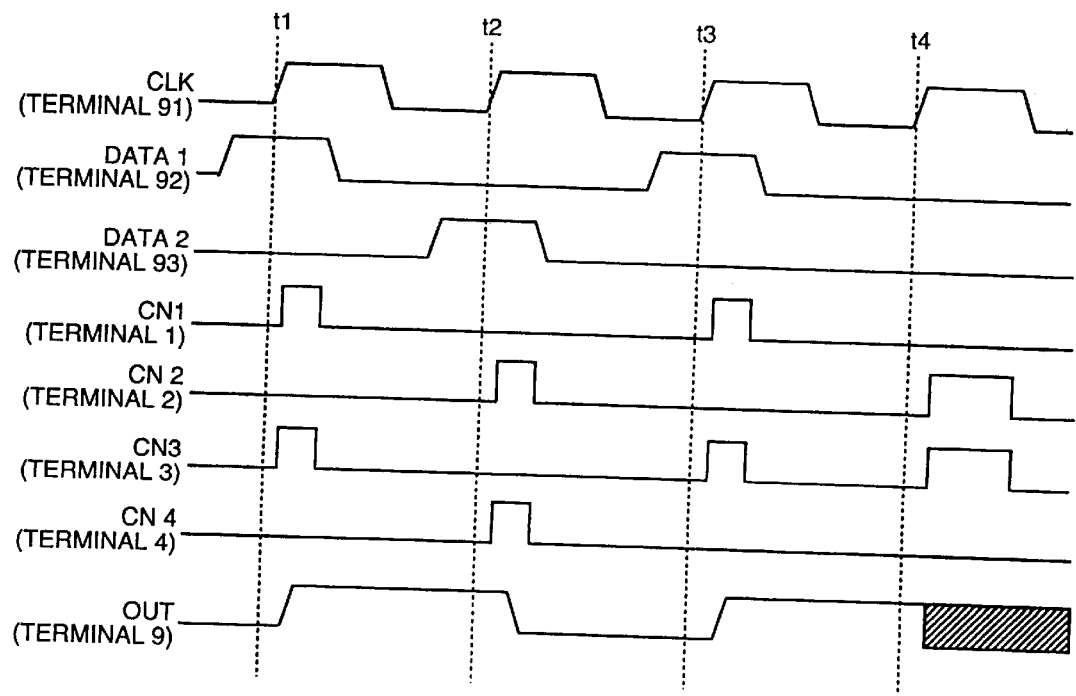
FIG. 5 is a timing chart for explaining the operation of signal generating circuit 70.

FIG. 5 is a timing chart for explaining of the operation of signal generating circuit 70. A signal inputted to signal terminal 1 of differential logic circuit 10 is referred to as control signals CN1 and a signal inputted to signal terminal 2 is referred to as control signal CN2, while a signal inputted to signal terminal 3 of differential logic circuit 20 is referred to as control signal CN3 and a signal inputted to signal terminal 4 is referred to as control signal CN4. During initialization, suppose that voltage levels of clock signal CLK, first data signal DATA1 and second data signal DATA2 are respectively L level. Accordingly, voltage levels of output signals of NAND gates 71 to 74 become H level, and hence voltage levels of output signals of inverters 85 and 86, and NAND gates 75 and 76 respectively become L level.

In FIG. 5, before time t1, voltage level of first data signal DATA1 becomes H level and voltage level of inverter 81 becomes L level. When clock signal CLK rises at time t1, voltage levels of three input signals of NAND gate 71 become H level while delayed by delay time caused by inverters 87 to 89. As a result, voltage level of output signal of NAND gate 71 becomes L level. Since voltage level of output signal of NAND gate 71 is inversed by inverter 85, voltage level of signal terminal 1 becomes H level.

At this time, voltage level of output signal of NAND gate 73 remains H level because voltage level of output signal of inverter 81 is L level. Further, voltage levels of NAND gates 72 and 74 remain H level. Accordingly, voltage level of output signal of NAND gate 76 becomes H level and voltage level of signal terminal 3 also becomes H level. Further, since there is no change in voltage level of the input signal, voltage level of output signal of NAND gate 75 remains L level and voltage level of output signal of inverter 86 also remains L level. As a result, voltage levels of signal terminals 2 and 4 remain L level.

Thereafter, when voltage level of first data signal DATA1 becomes L level, voltage level of output signal of inverter 81 and voltage level of output signal of NAND gate 71 respectively become H level, and hence voltage level of output signal of inverter 85 and voltage level of output signal of NAND gate 76 respectively become L level. As a result, voltage level of signal terminals 1 and 3 become L level.

Before time t2 after clock signal CLK falls, voltage level of second data signal DATA2 becomes H level and voltage level of output signal of inverter 82 becomes L level. When clock signal CLK rises at time t2, voltage levels of three input signals of NAND gate 72 respectively become H level while delayed by delay time caused by the inverters 87 to 89. As a result, voltage level of output signal of NAND gate 72 becomes L level. Since voltage level of output signal of NAND gate 72 is inversed by the inverter 86, voltage level of signal terminal 4 becomes H level.

At this time, voltage level of output signal of NAND gate 74 remains H level because voltage level of output signal of the inverter 82 is L level. Further, voltage levels of NAND gates 71 and 73 remain H level. Accordingly, voltage level of output signal of NAND gate 75 becomes H level and voltage level of signal terminal 2 also becomes H level. Further, since there is no change in voltage level of the input signal, voltage level of output signal of NAND gate 76 remains L level and voltage level of output signal of the inverter 85 also remains L level. As a result, voltage levels of signal terminals 1 and 3 remain L level.

Thereafter, when voltage level of second data signal DATA2 becomes L level, voltage level of output signal of the inverter 82 and voltage level of output signal of NAND gate 72 respectively become H level, and hence voltage level of output signal of the inverter 86 and voltage level of output signal of NAND gate 75 respectively become L level. As a result, voltage levels of signal terminals 2 and 4 become L level.

Before time t3 after clock signal CLK falls, voltage level of first data signal DATA1 becomes H level and voltage level of output signal of the inverter 81 becomes L level. When clock signal CLK rises at time t3, voltage levels of three input signals of NAND gate 71 respectively become H level while delayed by delay time caused by the inverters 87 to 89. Accordingly, at time t3, voltage levels of signal terminals 1 and 3 become H level and voltage levels of signal terminals 2 and 4 remain L level likewise at time t1.

Thereafter, when voltage level of first data signal DATA1 becomes L level, voltage levels of signal terminals 1 and 3 become L level. When voltage levels of first data signal DATA1 and second data signal DATA2 remain L level after clock signal CLK falls, clock signal CLK rises at a time t4.

Although voltage levels of the inverters 81 and 82 and those of NAND gates 71 and 72 respectively remain H level, voltage levels of four input signals of NAND gates 73 and 74 become H level. Accordingly, the voltage levels of output signals of NAND gates 73 and 74 become L level. As a result, the voltage levels of output signals of NAND gates 75 and 76 become H level, and hence voltage levels of signal terminals 2 and 3 become H level.

Since there is no change in voltage level of the input signal, the voltage levels of output signals of NAND gates 71 and 72 remain H level. As a result, voltage levels of signal terminals 1 and 4 remain L level.

When clock signal CLK falls thereafter, the voltage levels of output signals of NAND gates 73 and 74 become H level, and hence the voltage levels of output signals of NAND gates 75 and 76 become L level. As a result, voltage levels of signal terminals 2 and 3 also become L level.

Described next are output signals of signal generating circuit 70 that is operated as set forth above, namely, the operations of differential logic circuits 10 and 20 and output circuit 100 caused by control signals CN1 to CN4 that are respectively inputted to signal terminals 1 to 4.

When voltage levels of control signals CN1 and CN3 are H level and voltage levels of control signals CN2 and CN4 are L level likewise at time t1 and time t3 in FIG. 5, voltage levels of node N1 of differential logic circuit 10 and node N3 of differential logic circuit 20 become L level and voltage levels of node N2 of differential logic circuit 10 and node N4 of differential logic circuit 20 become H level as mentioned above.

Accordingly, since clocked inverter 31 operates as an inverter, it outputs output signal of L level in voltage level. Further, since PMOSes 32-1 and 32-2 become nonconductive and NMOS 32-3 becomes conductive as shown in FIG. 3, clocked inverter 32 outputs output signal of L level in voltage level. That is, this is seemingly the same as if clocked inverter 32 functioned as an inverter.

Here, although voltage level of node N1 is L level and PMOS 41 becomes conductive, voltage level of node N4 is H level and PMOS 42 becomes nonconductive. Accordingly, the power supply voltage Vcc is not applied to node N5 via PMOSes 41 and 42. Likewise, although voltage level of node N2 is H level and NMOS 51 becomes conductive, voltage level of node N3 is L level and NMOS 52 becomes nonconductive. Accordingly, the ground voltage Vss is not applied to node N6 via NMOSes 51 and 52.

As a result, a signal of L level in voltage level is inputted to gate electrode of PMOS 61 and that of NMOS 62 respectively constituting the output stage of output circuit 100. PMOS 61 becomes conductive and NMOS 62 becomes nonconductive in response to voltage level of the signal inputted to gate electrodes thereof. Since the power supply voltage Vcc is applied to output terminal 9 via conductive PMOS 61, voltage level of output terminal 9 becomes H level as represented by output signal OUT that is outputted from output terminal 9 in FIG. 5.

Even if voltage levels of control signals CN1 and CN3 become L level, voltage levels of nodes N1 and N3 remain L level and voltage levels of nodes N2 and N4 remain H level by NMOSes 13 and 14 of differential logic circuit 10 and NMOSes 23 and 24 of differential logic circuit 20. Accordingly, voltage level of output terminal 9 remains H level.

Next, likewise at time t2 in FIG. 5, when voltage levels of control signals CN2 and CN4 are H level and voltage levels of control signals CN1 and CN3 are L level, voltage level of node N2 of differential logic circuit 10 and that of node N4 of differential logic circuit 20 become L level and voltage level of node N1 of differential logic circuit 10 and that of node N3 of differential logic circuit 20 become H level.

Accordingly, since clocked inverter 32 operates as an inverter, it outputs output signal of H level in voltage level. Further, since NMOSes 31-2 and 31-3 become nonconductive and PMOS 31-1 becomes conductive as shown in FIG. 2, clocked inverter 31 outputs output signal of H level in voltage level. That is, this is seemingly the same as if clocked inverter 32 functioned as an inverter.

Here, although the voltage level of node N4 is L level and PMOS 42 becomes conductive, voltage level of node N1 is H level and PMOS 41 becomes nonconductive. Accordingly, the power supply voltage Vcc is not applied to node N5 via PMOSes 41 and 42. Likewise, although voltage level of node N3 is H level and NMOS 52 becomes conductive, voltage level of node N2 is L level and NMOS 51 becomes nonconductive. Accordingly, the ground voltage Vss is not applied to node N6 via NMOSes 51 and 52.

As a result, a signal of H level in voltage level is inputted to gate electrode of PMOS 61 and that of NMOS 62 respectively constituting the output stage of output circuit 100. PMOS 61 becomes nonconductive and NMOS 62 becomes conductive in response to voltage level of the signal inputted to gate electrodes thereof. Since the ground voltage Vss is applied to output terminal 9 via conductive NMOS 62, voltage level of output terminal 9 becomes L level as represented by output signal OUT in FIG. 5.

Even if voltage levels of control signals CN2 and CN4 become L level, voltage levels of nodes N1 and N3 remain H level and voltage levels of nodes N2 and N4 remain L level by NMOSes 13 and 14 of differential logic circuit 10 and NMOSes 23 and 24 of differential logic circuit 20. Accordingly, voltage level of output terminal 9 remains L level.

Next, likewise at time t4 in FIG. 5, when voltage levels of control signals CN2 and CN3 are H level and voltage levels of control signals CN1 and CN4 are L level, voltage level of node N2 of differential logic circuit 10 and that of node N4 of differential logic circuit 20 become L level and voltage level of node N1 of differential logic circuit 10 and that of node N3 of differential logic circuit 20 become H level.

Accordingly, since NMOS 31-2 shown in FIG. 2 and PMOS 32-2 shown in FIG. 3 respectively become conductive, clocked inverters 31 and 32 respectively operate as inverters. Since voltage level of node N2 is L level, voltage level of node N4 is H level, clocked inverter 32 outputs output signal of L level in voltage level.

Here the voltage levels of nodes N1 and N4 are respectively H level and PMOSes 41 and 42 are nonconductive. Accordingly, the power supply voltage Vcc is not applied to node N5 via PMOSes 41 and 42. Likewise, voltage levels of nodes N2 and N3 are respectively L level and NMOSes 51 and 52 are nonconductive. Accordingly, the ground voltage Vss is not applied to node N6 via NMOSes 51 and 52.

As a result, a signal of H level in voltage level is inputted to gate electrode of PMOS 61 constituting the output stage of output circuit 100 and a signal of L level in voltage level is inputted to gate electrode of NMOS 62. PMOS 61 and NMOS 62 respectively become nonconductive in response to voltage levels of the signals inputted to gate electrodes thereof. Since the power supply voltage Vcc and ground voltage Vss are not applied to output terminal 9, voltage level of output terminal 9 becomes a high impedance state as shown in the hatching depicted in output signal OUT in FIG. 5.

Even if clock signal CLK falls and voltage levels of control signals CN2 and CN3 become L level, voltage levels of nodes N2 and N3 remain L level and voltage levels of nodes N1 and N4 remain H level by NMOSes 13 and 14 of differential logic circuit 10 and NMOSes 23 and 24 of differential logic circuit 20. Accordingly, output terminal 9 remains in the high impedance state.

That is, if signal generating circuit 70, differential logic circuits 10 and 20 and output circuit 100 are viewed as a whole, voltage level of output signal OUT of output circuit 100 becomes H level when first data signal DATA1 is inputted to signal generating circuit 70, namely, when voltage level becomes H level in response to the rising of clock signal CLK. The voltage level of output signal OUT of output circuit 100 becomes L level when second data signal DATA2 is inputted to signal generating circuit 70, namely, when voltage level becomes H level in response to the rising of clock signal CLK. The voltage level of output signal OUT of output circuit 100 becomes a high impedance state when first data signal DATA1 and second data signal DATA2 are not inputted to signal generating circuit 70, namely, when voltage level becomes L level in response to the rising of clock signal CLK.

As the entire configuration of signal generating circuit 70, differential logic circuits 10 and 20 and output circuit 100, output signal OUT of output circuit 100 can be set to either H level in voltage level, L level in voltage level or high impedance state depending on voltage levels of first data signal DATA1 and second data signal DATA2.

Since signal generating circuit 70 sets the time when voltage level of first data signal DATA1 is rendered to H level or the time when voltage level of second data signal DATA2 is rendered to H level after it renders voltage level of first data signal DATA1 and that of second data signal DATA2 to L level, both voltage level of first data signal DATA1 and that of second data signal DATA2 are not rendered to H level. Accordingly, it is possible to prevent the production of feedthrough current by differential logic circuits 10 and 20.

Even if a noise is generated in the data signal so that both voltage level of first data signal DATA1 and that of second data signal DATA2 are respectively rendered to H level, the influence by the noise applied to differential logic circuits 10 and 20 can be reduced because the states of differential logic circuits 10 and 20 are switched in response to the rising of clock signal CLK.

The operation of output circuit 100 as set forth above is that in a case where voltage levels of nodes N2 and N4 are not delayed when voltage levels thereof are determined, namely, PMOS 61 and NMOS 62 constituting the output stage of output circuit 100 are not simultaneously conductive. Described next is a case where the determination of voltage level of node N2 and that of node N4 are delayed.

Figure 6:
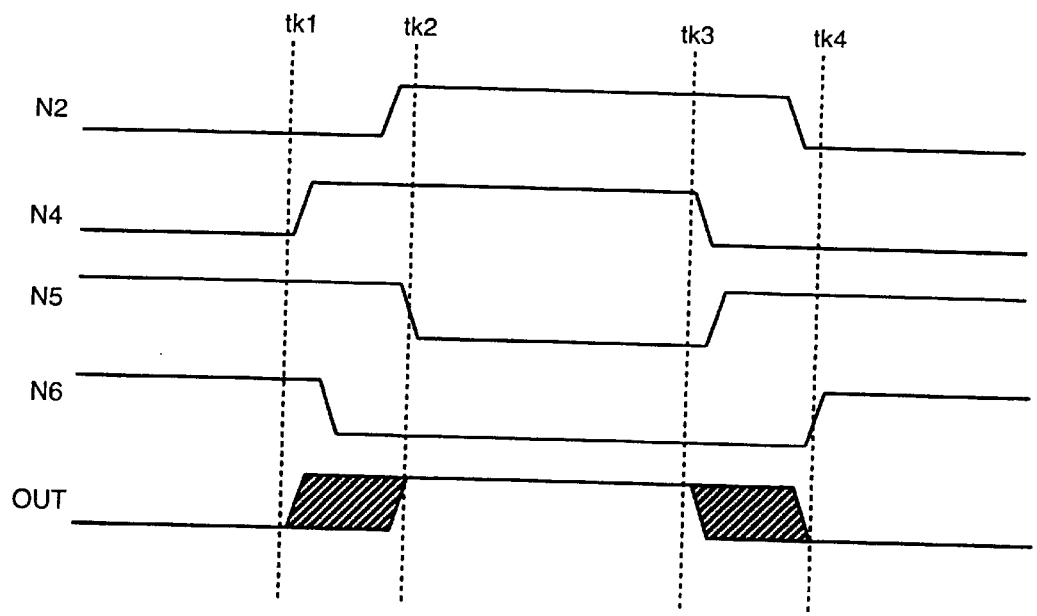
FIG. 6 is a timing chart showing the operation of output circuit 100 in case that the change of voltage level of node N2 is behind voltage level of node N4 in FIG. 1.
Figure 7:
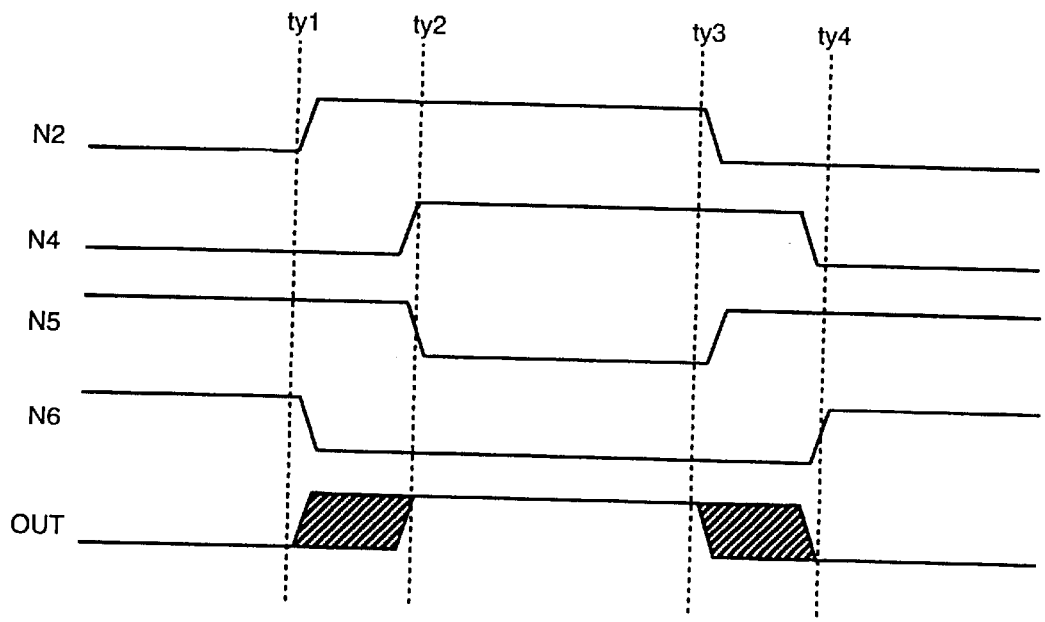
FIG. 7 is a timing chart showing the operation of output circuit 100 in case that the change of voltage level of node N4 is behind voltage level of node N2.

FIG. 6 is a timing chart showing the operation of output circuit 100 in a case where the change of voltage level of node N2 is behind that of node N4, and FIG. 7 is a timing chart showing the operation of output circuit 100 in a case where the change of voltage level of node N4 is behind that of node N2.

Described first with reference to FIG. 56 is a case where the change of voltage level of node N2 is behind that of node N4.

In FIG. 6, suppose that voltage levels of nodes N2 and N4 are L level during the initialization. Accordingly, voltage levels of nodes N5 and N6 are H level in response to output signals of clocked inverters 31 and 32. Although not illustrated, voltage levels of nodes N1 and N3 have complementary relation with those of nodes N2 and N4. Accordingly, since PMOS 41 and NMOS 51 are nonconductive, the power supply voltage Vcc is not applied to node N5 via PMOSes 41 and 42 and the ground voltage Vss is not applied to node N6 via NMOS 51 and NMOS 52. Accordingly, since PMOS 61 is nonconductive and NMOS 62 is conductive, voltage level of output signal OUT of output terminal 9 is L level.

Thereafter, suppose that voltage level of node N4 is first changed from L level to H level at time tk1. At this time, although not illustrated, voltage level of node N3 is changed from H level to L level.

In clocked inverter 31, although NMOS 31-2 becomes conductive in response to voltage level of node N4, while PMOS 31-1 is conductive and NMOS 31-3 is nonconductive because voltage level of node N2 is L level. Accordingly, voltage level of output signal of clocked inverter 31 remains H level and voltage level of node N5 remains H level. At this time, since voltage levels of nodes N1 and N4 become H level, both PMOSes 41 and 42 are nonconductive.

In clocked inverter 32, although PMOS 32-2 becomes conductive in response to voltage level of node N2, while PMOS 32-1 is nonconductive and NMOS 32-3 is conductive because voltage level of node N4 is H level. Accordingly, voltage level of output signal of clocked inverter 32 becomes L level and voltage level of node N6 is changed from H level to L level. At this time, since voltage levels of nodes N2 and N3 become L level, both NMOSes 51 and 52 are nonconductive.

Since PMOS 61 and NMOS 62 respectively become nonconductive in response to voltage level of node N5 and that of node N6, output signal OUT outputted from output terminal 9 becomes high impedance state (hatched portion in FIG. 6).

Next, suppose that voltage level of node N2 is changed from L level to H level at time tk2. At this time, although not illustrated, voltage level of node N1 is changed from H level to L level.

In clocked inverter 31, since NMOS 31-2 is conductive while PMOS 31-1 becomes nonconductive and NMOS 31-3 becomes conductive because voltage level of node N2 becomes H level. Accordingly, voltage level of output signal of clocked inverter 31 is changed from H level to L level. At this time, although PMOS 41 becomes conductive because voltage level of node N1 becomes L level, the power supply voltage Vcc is not applied to node N5 via PMOSes 41 and 42 because PMOS 42 remains nonconductive. Accordingly, voltage level of node N5 becomes L level.

In clocked inverter 32, although PMOS 32-2 becomes nonconductive because voltage level of node N2 becomes H level, voltage level of output signal of clocked inverter 32 remains L level because PMOS 32-1 is nonconductive and NMOS 32-3 is conductive. At this time, although NMOS 51 becomes conductive in response to voltage level of node N2, the ground voltage Vss is not applied to node N6 via NMOSes 51 and 52 because NMOS 52 remains nonconductive. Accordingly, voltage level of node N6 remains H level.

Since PMOS 61 becomes conductive and NMOS 62 becomes nonconductive in response to voltage level of node N5 and that of node N6, voltage level of output signal OUT outputted from output terminal 9 becomes H level.

Then, suppose that voltage level of node N4 is first changed from H level to L level at time tk3. At this time, although not illustrated, voltage level of node N3 is changed from L level to H level.

In clocked inverter 31, NMOS 31-2 becomes nonconductive in response to voltage level of node N4. PMOS 31-1 is nonconductive and NMOS 31-3 is conductive because voltage level of node N2 is H level. Accordingly, voltage level of output signal of clocked inverter 31 becomes high impedance state. At this time, since voltage levels of nodes N1 and N4 become L level, both PMOSes 41 and 42 are conductive. Consequently, the power supply voltage Vcc is applied to node N5 via PMOSes 41 and 42. As a result, voltage level of node N5 is set to H level.

In clocked inverter 32, PMOS 32-1 becomes conductive and NMOS 32-3 becomes nonconductive in response to voltage level of node N4. PMOS 32-2 is nonconductive because voltage level of node N2 is L level. Accordingly, voltage level of output signal of clocked inverter 32 becomes high impedance state. At this time, since voltage levels of nodes N2 and N3 become H level, both NMOSes 51 and 52 are conductive. Consequently, the ground voltage Vss is applied to node N6 via NMOSes 51 and 52. As a result, voltage level of node N6 remains L level.

Since PMOS 61 and NMOS 62 become nonconductive in response to voltage level of node N5 and that of node N6, voltage level of output signal OUT outputted from output terminal 9 becomes high impedance state (hatched portion in FIG. 6).

Next, suppose that voltage level of node N2 is changed from H level to L level at time tk4. At this time, although not illustrated, voltage level of node N1 is changed from L level to H level.

In clocked inverter 31, since NMOS 31-2 is nonconductive and voltage level of node N2 becomes L level, PMOS 31-1 becomes conductive and NMOS 31-3 becomes nonconductive. Accordingly, voltage level of output signal of clocked inverter 31 changes from the high impedance state to H level. At this time, since voltage level of node N1 becomes H level, PMOS 41 becomes nonconductive, and hence the power supply voltage Vcc is applied to node N5 via PMOSes 41 and 42. As a result, voltage level of node N5 remains H level.

In clocked inverter 32, PMOS 32-2 is conductive because voltage level of node N2 becomes L level. Here, since PMOS 32-1 is conductive and NMOS 32-3 is nonconductive, voltage level of output signal of clocked inverter 32 is changed from high impedance state to H level. At this time, since NMOS 51 becomes nonconductive in response to voltage level of node N2, the ground voltage Vss is not applied to node N6 is changed from L level to H level.

Since PMOS 61 becomes nonconductive and NMOS 62 becomes conductive in response to voltage level of node N5 and that of node N6, output signal OUT outputted from output terminal 9 becomes L level.

Described next with reference to FIG. 7 is a case where the change of voltage level of node N4 is behind that of node N2.

In the initializing state in FIG. 7, voltage levels of nodes N2 and N4 are L level, voltage levels of nodes N5 and N6 are H level and voltage level of output signal OUT outputted from output terminal 9 is L level in the same manner as shown in FIG. 6.

Suppose that voltage level of node N2 is first changed from L level to H level at time ty1. At this time, although not illustrated, voltage level of node N1 is changed from H level to L level.

In clocked inverter 31, although PMOS 31-1 becomes nonconductive and NMOS 31-3 becomes conductive in response to voltage level of node N2, while NMOS 31-2 is nonconductive because voltage level of node N4 is L level. Accordingly, voltage level of output signal of clocked inverter 31 becomes high impedance state. At this time, since voltage levels of nodes N1 and N4 become L level, both PMOSes 41 and 42 are conductive. Consequently, the power supply voltage Vcc is applied to node N5 via PMOSes 41 and 42. As a result, voltage level of node N5 remains H level.

In clocked inverter 32, although PMOS 32-2 becomes nonconductive in response to voltage level of node N2. PMOS 32-1 is conductive and NMOS 32-3 is nonconductive because voltage level of node N4 is L level. Accordingly, voltage level of output signal of clocked inverter 32 becomes high impedance state. At this time, since voltage levels of nodes N2 and N3 become H level, both NMOSes 51 and 52 become conductive. Consequently, the ground voltage Vss is applied to node N6 via NMOSes 51 and 52. As a result, voltage level of node N6 is set to L level from H level.

Since PMOS 61 and NMOS 62 respectively become nonconductive in response to voltage level of node N5 and that of node N6, output signal OUT outputted from output terminal 9 becomes high impedance state (hatched portion in FIG. 7).

Next, suppose that voltage level of node N4 is changed from L level to H level at time ty2. At this time, although not illustrated, voltage level of node N3 is changed from H level to L level.

In clocked inverter 31, NMOS 31-2 becomes conductive. The voltage level of output signal of clocked inverter 31 is changed from high impedance state to L level because PMOS 31-1 is nonconductive and NMOS 31-3 is conductive. At this time, the power supply voltage Vcc is not applied to node N5 via PMOSes 41 and 42 because PMOS 42 becomes nonconductive in response to voltage level of node N4. As a result, voltage level of node N5 is changed from H level to L level.

In clocked inverter 32, NMOS 31-2 becomes conductive. PMOS 32-1 becomes nonconductive and NMOS 32-3 becomes conductive in response to voltage level of node N4. Accordingly, output signal of clocked inverter 32 is changed from high impedance state to L level. At this time, NMOS 52 becomes nonconductive in response to voltage level of node N3. Accordingly, the ground voltage Vss is not applied to node N6 via NMOSes 51 and 52. As a result, voltage level of node N6 remains L level.

Since PMOS 61 becomes conductive and NMOS 62 becomes nonconductive in response to voltage level of node N5 and that of node N6, output signal OUT outputted from output terminal 9 becomes H level.

Next, suppose that voltage level of node N2 is first changed from H level to L level at time ty3. At this time, although not illustrated, voltage level of node N1 is changed from L level to H level.

In clocked inverter 31, since NMOS 31-2 is conductive and voltage level of node N2 becomes L level, PMOS 31-1 becomes conductive and NMOS 31-3 becomes nonconductive. Accordingly, voltage level of output signal of clocked inverter 31 is changed from L level to H level. At this time, since voltage level of node N1 becomes H level, PMOS 41 becomes nonconductive while since PMOS 42 remains nonconductive, the power supply voltage Vcc is not applied to node N5 via PMOSes 41 and 42. Accordingly, voltage level of node N5 is changed from L level to H level.

In clocked inverter 32, PMOS 32-2 becomes conductive in response to voltage level of node N2. Since voltage level of node N4 is H level, PMOS 32-1 is nonconductive and NMOS 32-3 is conductive. Accordingly, voltage level of output signal of clocked inverter 32 becomes L level. At this time, NMOS 51 becomes nonconductive because voltage level of node N2 becomes L level. Accordingly, the ground voltage Vss is not applied to node N6 via NMOSes 51 and 52. As a result, voltage level of node N6 remains L level.

Since PMOS 61 and NMOS 62 become nonconductive in response to voltage level of node N5 and that of node N6, output signal OUT outputted from output terminal 9 becomes high impedance state (hatched portion in FIG. 7).

Next, suppose that voltage level of node N4 is changed from H level to L level at time ty4. At this time, although not illustrated, voltage level of node N3 is changed from L level to H level.

In clocked inverter 31, although NMOS 31-2 becomes nonconductive because voltage level of node N4 becomes L level, PMOS 31-1 is conductive and NMOS 31-3 is nonconductive. Accordingly, voltage level of output signal of clocked inverter 31 remains H level. At this time, voltage level of node N4 also becomes L level and PMOS 42 becomes supply voltage Vcc is not applied to node N5 via PMOSes 41 and 42. Accordingly, voltage level of node N5 remains H level.

In clocked inverter 32, PMOS 32-1 becomes conductive and NMOS 32-3 becomes nonconductive in response to voltage level of node N4. Since voltage level of node N2 is L level, PMOS 32-2 is conductive. Accordingly, voltage level of output signal of clocked inverter 32 is changed from L level to H level. At this time, NMOS 52 becomes conductive and NMOS 51 remains nonconductive because voltage level of node N3 becomes H level, so that the ground voltage Vss is not applied to node N6 via NMOSes 51 and 52. As a result, voltage level of node N6 is changed from L level of H level.

Since PMOS 61 becomes nonconductive and NMOS 62 becomes conductive in response to voltage level of node N6 and that of node N6, output signal OUT outputted from output terminal 9 becomes L level.

As explained with reference to FIGS. 6 and 7, if there occurs a delay between the change of voltage level of node N2 and that of node N4, PMOS 61 and NMOS 62 constituting the output stage of output circuit 100 are rendered nonconductive and output terminal 9 is rendered to high impedance state. As mentioned above, a case where output terminal 9 becomes high impedance state is for a delay time that occurs between the change of voltage level of node N2 and that of node N4. Accordingly, since PMOS 61 and NMOS 62 are rendered nonconductive for a necessary time in response to the delay time, output signal OUT having a given voltage level can be outputted from output terminal 9 without rendering output terminal 9 to be high impedance state if there does not occur any delay between the change of voltage level of node N2 and that of node N4. Accordingly, the feedthrough current in the output stage of output circuit 100 can be efficiently reduced without deteriorating high speed responsivity of output circuit 100.

As evident from the explanation with reference to FIGS. 6 and 7, both PMOS 61 and NMOS 62 constituting output stage of output circuit 100 become conductive at the same time when voltage level of node N5 is L level and voltage level of node N6 is H level, namely, when voltage level of node N2 is H level and voltage level of node N4 is L level. In such a timing, outputs of clocked inverts 31 and 32 is rendered to high impedance state while voltage level of node N5 is pulled up to H level by PMOSes 41 and 42 and voltage level of node N5 is pulled down to L level by NMOSes 51 and 52. Accordingly, the nonconductive state of PMOS 61 and NMOS 62 is stabilized by pulling up and down node N5. The nonconductive state of both PMOS 61 and 62 is stabilized even if noise is generated in nodes N2 and N4 since output of clocked inverter 31 becomes high impedance state or H level in voltage level while output of clocked inverter 32 becomes high impedance state of L level in voltage level.

In output circuit 100, there are provided merely three MOS transistors in clocked inverts 31 and 32, and respective two MOS transistors in pulling up node N5 or pulling down node N6, and hence the feedthrough current can be reduced without increasing a circuit construction by a large margin.

Further, in output circuit 100, the delay may be to an extent by delay of one stage of clocked inverter until signal reaches by a first stage of clocked inverter until the change of voltage levels of node N2 and node N4 forming inputs of output circuit 100 is applied to the MOS transistors constituting the output circuit 100. Clocked inverts 31 and 32 can change voltage level of output signal OUT of output circuit 100 reliably at high speed by shaping waveforms of signals inputted from node N2 and node N4 set by differential logic circuits 10 and 20 to apply to the output stage of output circuit 100.

Still further, in signal generating circuit 70, differential logic circuits 10 and 20 are operated in response to control signals CN1 to CN4 that are generated by two data signals DATA1 and DATA2, and clock signal CLK so as to keep voltage level of input signals inputted to output circuit 100. Accordingly, voltage level of output signal OUT of output circuit 100 can be kept to a stable state even after voltage level of output signal OUT of output circuit 100 is changed and voltage level of data signal is changed in synchronization with clock signal CLK without keeping voltage levels of data signals DATA1 and DATA2.

Figure 8:
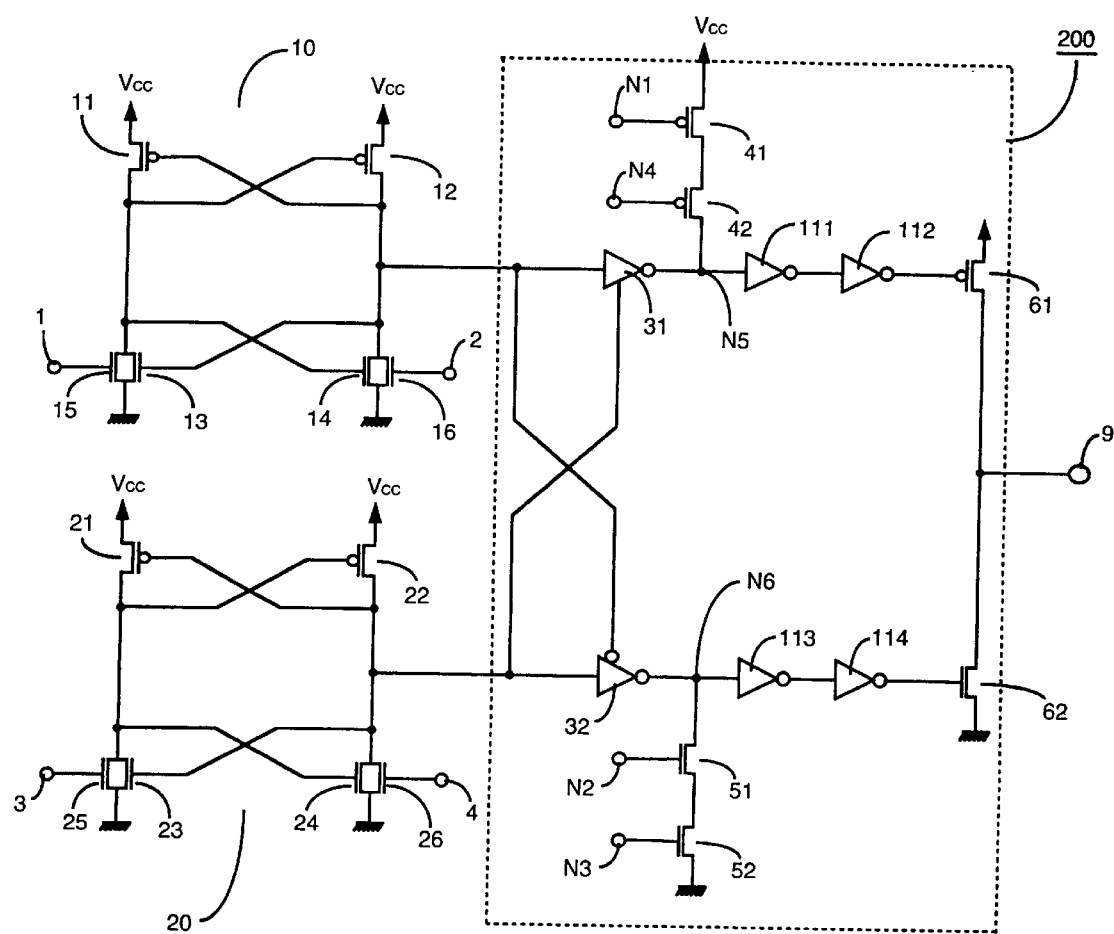
FIG. 8 is a circuit diagram of an output circuit 200 according to a second embodiment of the invention.

Described next with reference to FIG. 8 is an output circuit according to a second embodiment of the second invention. FIG. 8 is a circuit diagram of output circuit 200. In FIG. 8, components which are the same as those in FIG. 1 are denoted by the same reference numerals and the overlapping explanation thereof is omitted.

In output circuit 200 of FIG. 8, inverters 111–114 are added to the components of output circuit 100 in FIG. 1. The other components in FIG. 8 are the same as those in FIG. 1. In FIG. 8, input terminal of inverter 111 is connected with node N5 and output terminal thereof is connected with input terminal of inverter 112. Output terminal of inverter 112 is connected with gate electrode of PMOS 61. Input terminal of inverter 113 is connected with node N6, and output terminal thereof is connected with input terminal of inverter 114. Output terminal of inverter 114 is connected with gate electrode of NMOS 62. That is, a signal transmitted to node N5 is supplied to gate electrode of PMOS 61 via inverters 111 and 112 while a signal transmitted to node N6 is supplied to gate electrode of NMOS 62 via inverters 113 and 114. Suppose that the driving capacity of the inverters 111–114 is the same and the delay speed thereof is also the same as those in FIG. 1.

In FIG. 8, signals transmitted to node N5 and node N6 are supplied to gate electrodes of PMOS 61 and NMOS 62 via two (even number of) inverters, and hence voltage levels of signals supplied to gate electrodes of PMOS 61 and NMOS 62 are the same as the case in FIG. 1. Accordingly, the operation of output circuit 200 in FIG. 8 is the same as that of output circuit 100 in FIG. 1.

If the driving capacity of PMOS 61 and NMOS 62 constituting the output stage of output circuit 200 is very large, the sizes thereof become large. There is a case of employment of clocked inverters 31 and 32, PMOSes 41 and 42 and NMOSes 51 and 52 respectively having relatively large size (they may be not greater than those of PMOS 61 and NMOS 62 in the output stage) to control PMOS 61 and NMOS 62. Accordingly, in FIG. 8, inverters 111–114 comprise PMOS and NMOS respectively having relatively large size (they may be not greater than those of PMOS 61 and NMOS 62 in the output stage). Accordingly, although output circuit 200 in FIG. 8 has four MOS transistors in addition to those employed by output circuit 100 in FIG. 1, the number of MOS transistors having a relatively large size may be small. As a result, if viewed from the output circuit as a whole, output circuit 200 in FIG. 8 is reduced in layout area compared with output circuit 100 in FIG. 1.

As mentioned above, although the second embodiment has delay by two stages of inverters compared with the first embodiment, it is expected to reduce the layout area of the semiconductor chip mounting the semiconductor integrate circuit having output circuit 200 thereon. Accordingly, output circuit 200 of the second embodiment is very effective in the case that there is a margin in the interval of change in voltage level of output signal OUT of output circuit 200.

In output circuit 200 of the second embodiment, the number of inverters may be more than two without limiting to two if there is a margin in the interval of change in voltage level of output signal OUT of output circuit 200. If buffers, in which voltage levels of input and output signals become the same, are employed instead of the inverters, one or more stages of buffers may be provided.

Although, the invention has been described in detail, the construction of the invention is not limited to those set forth in the first and second embodiments.

For example, in the case that the output stage of the output circuit comprises NMOS alone such as dynamic random access memory, if odd number of inverters may be provided between node N5 and gate electrode of NMOS provided instead of PMOS 61, the same effect as the invention can be achieved. On the other hand, in the case that the output stage of the output circuit comprises PMOS alone such as dynamic random access memory, if odd numbers of inverters may be provided between node N6 and gate electrode of PMOS provided instead of NMOS 62, the same effect as the invention can be achieved.

If the same operation of the invention can be achieved, PMOS may be changed to NMOS and vice versa.

Clocked inverters 31 and 32 may be substituted by clocked buffers if the voltage level of input signal become the same as that of output signal. In this case, the same operation as mentioned in the first and second embodiments can be realized if odd number of inverters are disposed between node N5 and gate electrode of PMOS 61 and between node N6 and gate electrode of NMOS 62, or PMOS 51 is substituted by NMOS and NMOS 62 is substituted by NMOS.

Further, although input signals of the output circuit are formed of output signals from the differential logic circuits in the first and second embodiments set forth above, output signals from other components may be inputted to the output circuit. For example, even if first and second data signal DATA1 and DATA2 are inputted to output circuit 100 or output 100 or output circuit 200 without passing through signal generating circuit 70 or differential logic circuits 10 and 20, feedthrough current is prevented from producing without deteriorating high speed responsivity that is the effect of the invention.

It is conceivable that the output circuit includes signal generating circuit 70 and differential logic circuits 10 and 20. In this case, this circuit is regarded as an output circuit capable of operating in response to clock signal CLK.

Still further, the circuit constructions of signal generating circuit 70 and differential logic circuits 10 and 20 are not limited to those set forth in first and second embodiments but they may be modified variously as a matter of course.

What is claimed is:

1. An output circuit for outputting an output signal that is set to either first voltage level, or second voltage level or high impedance state in response to voltage levels of first and second data signals, said output circuit comprising:

a first gate circuit that is connected with a first node to which a first signal having a voltage level which is set at least by one voltage level of either first or second data signal is transmitted, and that shapes a waveform of the first signal;

a second gate circuit that is connected with a second node to which a second signal having a voltage level which is set at least by one voltage level of either first or second data signal is transmitted, and that shapes a waveform of the second signal;

a first transistor for electrically connecting a first power voltage supply terminal and an output terminal thereof in response to a voltage level of an output signal of the first gate circuit;

a second transistor for electrically connecting a second power voltage supply terminal and an output terminal thereof in response to a voltage level of the output signal of the second gate circuit;

a first control circuit for applying a voltage, that renders the first transistor nonconductive in response to a voltage level of the second node, to a gate electrode of the first transistor; and a second control circuit for applying a voltage, that renders the second transistor nonconductive in response to a voltage level of the first node, to a gate electrode of the second transistor;

wherein the first gate circuit is selectively set to a state capable of outputting the first signal that has been shaped in waveform, or to a high impedance state in response to the voltage level of the second node, and wherein the second gate circuit is selectively set to a state capable of outputting the second signal that has been shaped in waveform, or to a high impedance state in response to the voltage level of the first node.

2. The output circuit according to claim 1, further comprising a plurality buffer circuits provided between an output respectively terminal of the first gate circuit and the gate electrode of the first transistor, and a plurality of buffer circuits provided between an output respectively terminal of the second gate circuit and the gate electrode of the second transistor.

3. The output circuit according to claim 2, wherein the first signal is formed of an output signal of a first differential logic circuit and the second signal is formed of an output signal of a second differential logic circuit.

4. The output circuit according to claim 3, wherein the first differential logic circuit receives first and second control signals as input signals which are generated in response to the voltage level of the first data signal and the voltage level of the second data signal, and the second differential logic circuit receives third and fourth control signals as input signals which are generated in response to the voltage level of the first data signal and the voltage level of the second data signal.

5. The output circuit according to claim 1, wherein the first signal is formed of an output signal of a first differential logic circuit and the second signal is formed of an output signal of a second differential logic circuit.

6. The output circuit according to claim 5, wherein the first differential logic circuit receives first and second control signals as input signals which are generated in response to the voltage level of the first data signal respectively and the voltage level of the second data signal, and the second differential logic circuit receives third and fourth control signals as input signals which are generated in response to the voltage level of the first data signal respectively and the voltage level of the second data signal.

* * * * *